United States Patent [19]

Kosinski

[11] Patent Number: 4,754,187

[45] Date of Patent: Jun. 28, 1988

[54] HIGH-Q STRESS-COMPENSATED CRYSTAL DEVICE

[75] Inventor: John A. Kosinski, Wall Township, N.J.

[73] Assignee: The United States of America as represented by the Secretary of the Army, Washington, D.C.

[21] Appl. No.: 94,202

[22] Filed: Sep. 8, 1987

[51] Int. Cl.$^4$ .............................................. H01L 41/08
[52] U.S. Cl. ................................... 310/361; 310/365; 310/366
[58] Field of Search ............... 310/360, 361, 367, 365, 310/366, 320

[56] References Cited

U.S. PATENT DOCUMENTS 4,625,138  11/1986  Ballato ................................. 310/320

OTHER PUBLICATIONS

"Excess Noise in Quartz Crystal Resonators", pp. 218-225, IIIE, 1983; J. J. Gagnepain and M. Oliver, Laboratoire de Physique et Metrologie des Oscillateurs du CNRS, France and F. L. Walls, Nat'l Bureau of Standards, Boulder, Col.

"Stress Compensated Orientations for Thickness-Shear Quartz Resonators", pp. 213-221; Bikash K. Sinha; Proc. 35th Ann. Freo. Control Symposium, USA-ERADCOM, Ft. Monmouth, N.J. 07703, May 1981.

"Lateral-Field Excitation of Quartz Plates", pp. 512-515, by Elizabeth R. Hatch and Arthur Ballato, reprinted from Proceedings of the Ultrasonice Symposium.

Primary Examiner—Mark O. Budd
Attorney, Agent, or Firm—Sheldon Kanars; John T. Rehberg

[57] ABSTRACT

A doubly rotated, stress and temperature compensated quartz crystal resonator. The crystal cuts are arbitrarity designated the SK1 and SK2 cuts. Lateral field excitation is used to excite only the b-mode of vibration (fast quasi-shear) and suppress the c mode (slow quasi-shear). Exclusive excitation of the b mode produces a resonator with a higher Q and lower phase noise than otherwise achievable.

8 Claims, 3 Drawing Sheets

HIGH-Q STRESS-COMPENSATED CRYSTAL DEVICE

The invention described described herein may be manufactured and used by or for the Government for governmental purposes without the payment of any royalties thereon or therefor.

FIELD OF THE INVENTION

This invention relates generally to the field of piezoelectric resonators and more particularly to quartz crystal resonators which have a high Q and are both stress and temperature compensated.

BACKGROUND OF THE INVENTION

Quartz crystal oscillators are frequently used to stabilize the frequency of electronic circuits. A quartz crystal acts as a stable mechanical resonator, which, by its piezoelectric behavior and high Q determines the frequency generated in an oscillator circuit. Various quartz crystal cuts, vibrating in a variety of modes are used to cover a wide range of frequencies. The Q values of quartz crystal units are much higher than those attainable with other conventional circuit elements.

Those concerned with the design of piezoelectric oscillators have consistently sought to discover new crystal cuts which have a high intrinsic Q. Furthermore, those concerned with the design of systems such as coherent radar, coherent communication systems, and phase-locked loops have consistently sought to reduce the noise inherent in such systems.

It has been determined empirically by J. J. Gagnepain et al., in "Excess Noise In Quartz Crystal Resonators," Proc. 37th Frequency Control Symposium, June 1983, pp. 218–225, that one form of noise, the close-in phase noise, i.e. flicker of frequency, or 1/f noise, is related to the intrinsic Q of a quartz crystal resonator by:

$$S_{yo}(1 \text{ Hz}) \approx \frac{2}{Q^4}$$

where $S_{yo}$ is the 1/f noise power one Hertz from the carrier. Thus, 1/f noise depends upon the resonator's unloaded Q according to a $1/Q^4$ law.

Quartz exhibits a variety of thickness modes of vibration. Three of the thickness modes of vibration are designated the a, b, and c modes. The a mode is a quasi-longitudinal mode. The b mode is a fast quasi-shear mode; the c mode is a slow quasi-shear mode. The intrinsic Q of the b mode is the highest possible in quartz; it can be up to twice that of the c mode, and 10 to 20 percent larger than that of the a mode.

It has been determined in Sinha, "Stress Compensated Orientation for Thickness-shear Quartz Resonators," Proc. 35th Annual Frequency Control Symposium, May 1981, pp. 340–344 that there are stress and temperature compensated quartz cuts which utilize the b mode of vibration. Such cuts would retain the desirable properties of the SC cut vibrating in the c mode while having the advantage of a greater intrinsic Q.

However, if the crystal cuts described by Sinha are fabricated with conventional thickness-field electrodes (i.e. a single electrode on top and bottom of the crystal) both the b and c mode will be excited. Since the b mode and c mode occur at approximately the same frequency, interference and resulting degradation of oscillator performance will occur.

Another method of crystal excitation is termed "lateral field excitation." Lateral field excitation is extensively discussed in U.S. Pat. No. 4,625,138, entitled "Piezoelectric Microwave Resonator Using Lateral Excitation," issued to A. Ballato. Lateral field excitation is also disclosed in a copending patent application entitled "Piezoelectric Resonators Having a Lateral Field Excited SC Cut Quartz Crystal Element, " Ser. No. 738,697, filed by A. Warner and assigned to the same assignee as the present invention.

Those concerned with precision frequency control and quartz oscillator development have consistently sought devices which exhibit high Q and low 1/f noise.

SUMMARY OF THE INVENTION

Accordingly, it is an object of the present invention to provide an improvement in piezoelectric resonators.

It is another object of the present invention to provide an improvement in quartz crystal resonators which operate exclusively in the b mode or fast quasi-shear mode of vibration.

It is a further object of the present invention to provide a quartz crystal resonator with a high intrinsic Q.

It is yet a further object of the present invention to provide a stress and temperature compensated quartz crystal resonator which utilizes the b mode of vibration, has a high intrinsic Q, and exhibits reduced 1/f noise.

Briefly, these and other objects are accomplished by utilizing two or four strategically placed electrodes on a special stress and temperature compensated crystal cut to excite only the desired b mode and effectively suppress the unwanted c mode of vibration. The electrodes are positioned to create a lateral-field excitation. Proper positioning of the electrodes eliminates the problem of mode interference (because the c mode is effectively suppressed) and creates a stress and temperature compensated quartz resonator with a maximum possible Q. The high Q of the resulting resonator contributes to a significant improvement in close-in phase noise when compared to the SC cut operating in the c mode.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DESCRIPTION OF THE PREFERRED EMBODIMENT

Figure 1:
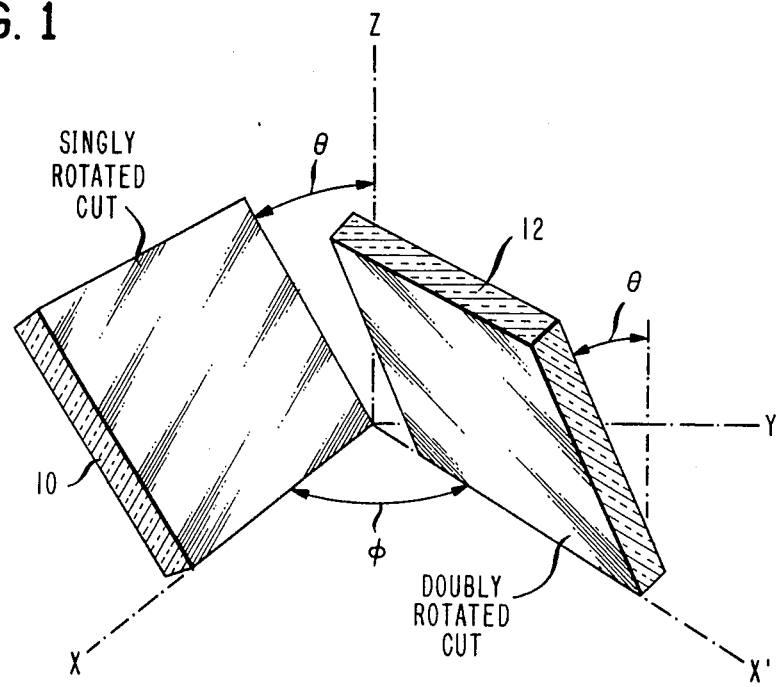
FIG. 1 is a diagram illustrative of singly rotated cut and doubly rotated cut quartz crystal resonator plates oriented in relation to their crystallographic axes.

Referring now to the drawings and more particularly to FIG. 1, shown thereat is a set of mutually perpendicular X, Y and Z axes which, as is well known, define the crystallographic axes of quartz crystal resonators according to a right handed rectangular Cartesian coordinate system. The X axis represents the electrical axis, the Y axis represents the mechanical axis, and the Z axis represents the optical axis. In FIG. 1, two relatively thin resonator plates 10 and 12 are shown for the purpose of illustrating the distinction between the well-known singly and doubly rotated cuts. The singly rotated cut resonator plate 10 has its major faces oriented at a polar angle $\theta$ with respect to the Z (optical) axis, while the doubly rotated cut plate 12 includes not only the angle $\theta$ but also a second polar angle $\phi$ which is an angle in relation to the X (electrical) axis. Thus, a doubly rotated cut quartz crystal resonator comprises a plate having crystallographic orientations which are a function of the two angles $\theta$ and $\phi$. The crystal plate orientations herein described are in accordance with the known "Standards on Piezoelectric Crystal, 1949" published in the proceedings of the I.R.E., December 1949, pp. 1378-1395. The above-mentioned publication defines a system of "Rotational Symbols" wherein Y X represents the initial orientation used in the present case as shown in FIG. 1, and wherein the first letter Y represents the direction of plate thickness before rotation, and the second letter X is the direction of plate length before rotation. The angle $\phi$ then represents the direction of first rotation about the Z axis or width direction with respect to the X axis and the angle $\theta$ is the second rotation about the X' axis or length direction with respect to the Z axis. The standard notation for the present doubly rotated crystal plate is thus (YXwl) ($\phi$, $\theta$).

Thus, many of the well-known quartz crystal cuts are described in terms of the aforementioned angles $\theta$ and $\phi$. For example, the well-known AT and BT cuts are called singly rotated cuts inasmuch as their angle $\phi$ is 0°. For the AT and BT cuts, the angle $\theta$ is in the region of $\pm 35°$ and $-50°$ respectively. Those crystal cuts which have a non-zero value for the angle $\phi$ are described as doubly rotated cuts. For example, the SC cut has the angle $\phi$ equal to 21.9°; and the angle $\theta$ equal to 34.0°.

Singly rotated quartz cuts with electrodes on the major faces vibrate in thickness shear with motion along the X axis and acoustic waves traveling in the thickness direction at resonance. In doubly rotated plates, three families of motion are in general produced piezoelectrically. These modes are called the a, b, and c modes, and they correspond respectively to thickness extension, fast thickness shear, and slow thickness shear waves. When $\phi$ equals 0° (i.e. the singly rotated cuts) the piezoelectric coupling coefficients driving the a and b modes are zero; only the c (slow shear) mode is driven. It is well known that as the angle $\phi$ is increased from zero (AT cut), if $\theta$ is kept roughly constant, it is found that the resulting cuts are less sensitive to thermal and stress effects. In addition, the strengths of the a and b modes increase from zero, while the strength of the c mode decreases. Each of the three vibrational modes can be found at a different frequency.

As mentioned before, one of the principal reasons for the use of quartz crystal resonators to stabilize the frequency of electronic devices is the high Q of quartz. For example, for SC cut quartz, vibrating in the c-mode, the maximum intrinsic Q value at 10 MHz is approximately $1.36 \times 10^6$.

It has been determined by Sinha in the above-referenced publication, that there are stress and temperature compensated cuts which utilize the b mode of vibration. As mentioned before, the b mode of vibration displays an intrinsic Q which is greater than that of the c mode.

In particular, the Sinha publication reveals that two crystal cuts, namely $\phi = 13°$, $\theta = -27.5°$ and $\phi = 14.2°$, $\theta = -30°$ are both stress and temperature compensated for the b mode of vibration. For convenience, these two cuts will be termed SK1 and SK2 respectively.

Unfortunately, it is not possible to excite the b mode alone in either of the two cuts mentioned above using conventional thickness field excitation. That is, electrodes placed both above and below a crystal plate cut in the manner just described, will tend to excite both the b mode and the c mode of vibration. Since the b mode and the c mode both occur at nearly the same frequency they would interfere with each other if excited in a conventional manner.

The present invention serves to excite only the b mode of vibration in the SK1 and SK2 cuts while suppressing the c mode of vibration. Consequently, the present invention produces a resonator which is stress and temperature compensated and has a higher Q and less phase noise than that exhibited by other stress and temperature compensated cuts.

Figure 2:
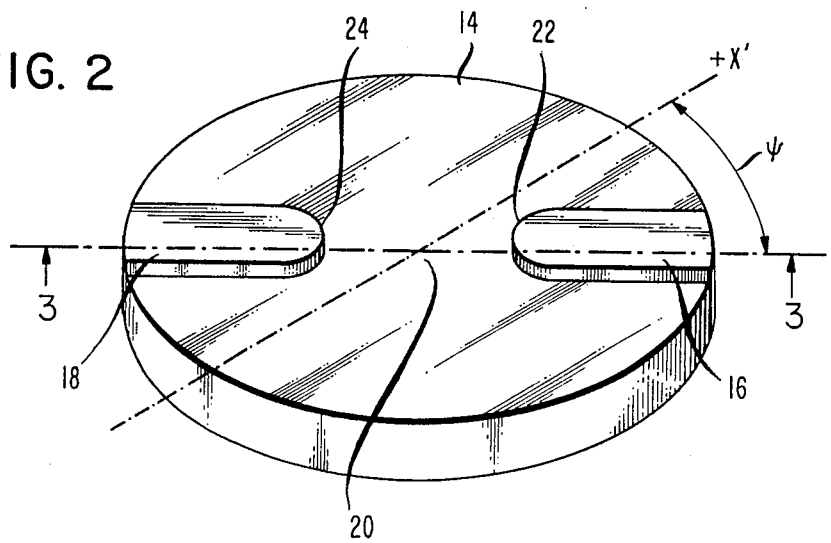
FIG. 2 is a perspective view generally illustrative of a first embodiment of the invention.

The present invention utilizes the aforementioned lateral field excitation to excite only the b mode and not the c mode in SK cuts. FIG. 2 depicts a piezoelectric crystal 14 with two electrodes 16 and 18 disposed upon its upper surface. The lateral excitation electrodes 16 and 18 extend along the top surface of piezoelectric crystal 14 from the outer edges. A region 20 in the center of crystal 14 is uncovered. The dimensions of the central region 20 are determined according to energy trapping rules, well-known to those skilled in the art. The electrode edges 22 and 24 nearest the central region 20 are curved or rounded to enhance the energy trapping phenomenon. The crystal 14 in FIG. 2 has a X' axis depicted thereon. The same X' axis is also illustrated in the reference diagram of FIG. 1. It can be seen from an examination of FIG. 2 that electrodes 16 and 18 are positioned at an azimuthal angle $\psi$ with respect to the X' axis. Strategic choice of the angle $\psi$ according to the teachings of the present invention permits strong excitation of the b mode of vibration, suppression of the c mode of vibration and all of the previously described benefits attendant thereon.

Figure 8:
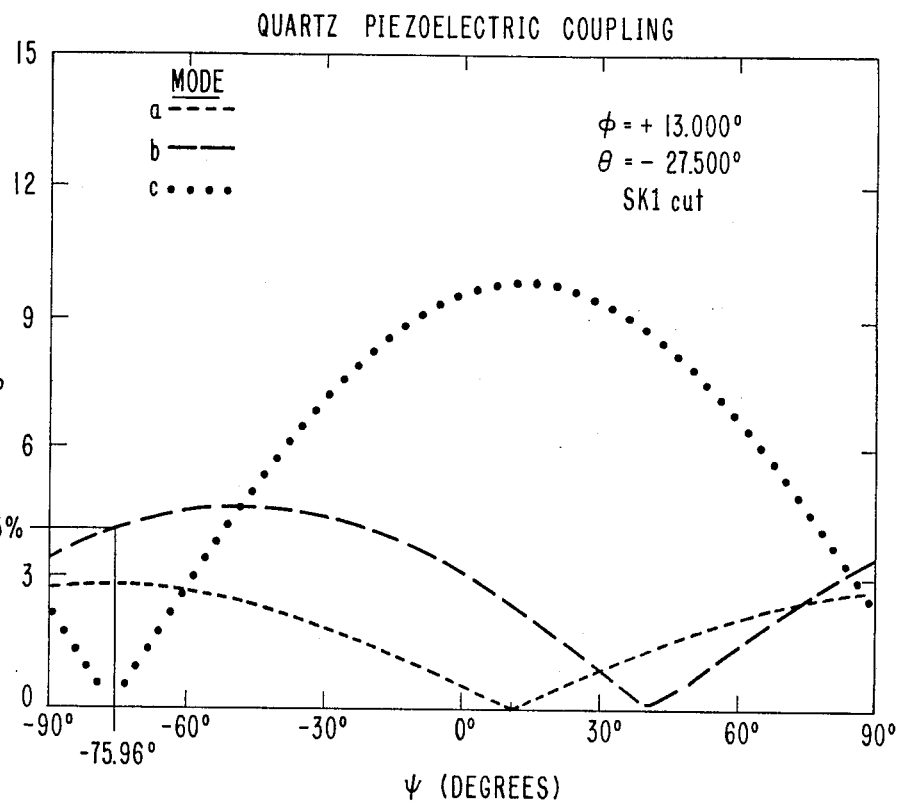
FIGS. 8 and 9 are graphs depicting the theoretical quartz piezoelectric coupling coeffecient for the crystal cuts which comprise the present invention.
Figure 9:
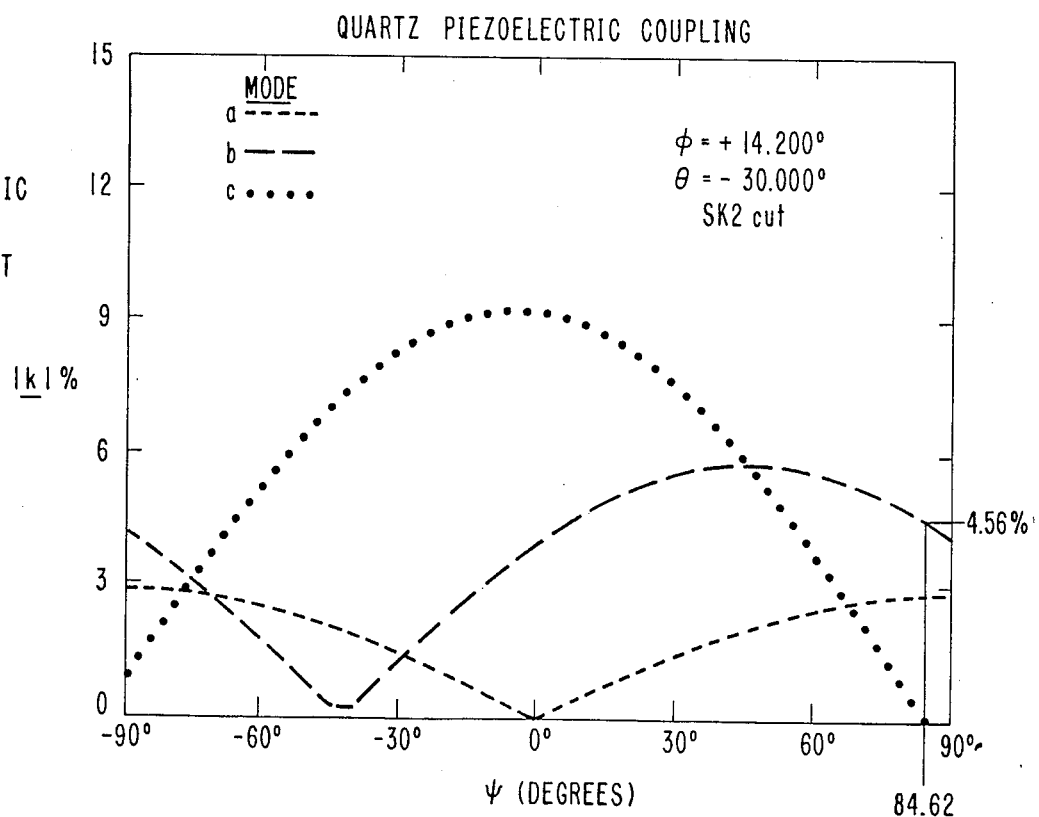

Turning now to FIGS. 8 and 9, there is shown the theoretical quartz piezoelectric coupling coefficient for both the SK1 cut and the SK2 cut as a function of $\psi$. The theoretical calculations which support the graphs of FIGS. 8 and 9 were performed using a computer and applying the techniques disclosed in Hatch et al. "Lateral Field Excitation of Quartz Plates" Proc. 1983, Ultrasonics Symposium, October 1983, pp. 512-515. Specifically, one notes in FIG. 8 for the SK1 cut that the c mode of vibration is predicted to be strongly coupled for $\psi$ between 0° and 30°. Further examination of FIG. 8 reveals that at $\psi = -75.96°$ the c mode of vibration is predicted to be suppressed, while the b mode is predicted to be relatively strongly coupled. (The coupling coefficient at $\psi = -75.96°$ is predicted to be 4.05%). Thus, turning to FIG. 2, the angle $\psi$ is predicted to be $-75.96°$ and the crystal plate 14 an SK1 cut (i.e. with $\phi = 13°$ and $\theta = -27.5°$) only the b mode with its desirable high Q should be excited.

Alternatively, the piezoelectric crystal 14 in FIG. 2 may be chosen as the SK2 cut and the graph of FIG. 9 might be employed to aid in the choice of the azimuthal angle $\psi$. Specifically, FIG. 9 predicts that for the SK2 cut (i.e. $\phi = +14.2°$, $\theta = -30.0°$) that the c mode vanishes for $\psi = 84.62°$, while the b mode is relatively strongly coupled. Consequently, if, in FIG. 2, piezoelectric crystal 14 is the SK2 cut, the angle $\psi$ should be chosen equal to 84.62°, according to theory.

Applicant made an attempt to experimentally verify the conclusions suggested by the graphs of FIGS. 8 and 9. The experimental results while qualititavely confirming the general shapes of the curves of FIGS. 8 and 9 do not show quantitative agreement. Specifically, for the SK1 cut, the angle $\psi$ must be chosen between $-30°$ and $0°$ to achieve desired c mode suppression. For the SK2 cut, the angle $\psi$ must be chosen between $-60°$ and $-30°$ (i.e. $-45° \pm 15°$). It is believed that inaccuracies in the presently accepted values of the elastic constants for quartz contribute to the discrepancy between theory and experiment.

Table 1 below lists for the SK1 and SK2 cuts the cut angles $\theta$ and and $\phi$ electrode angle $\psi$; the piezoelectric coupling coefficient K, the Q at 10 MHz, and the improvement in close-in phase noise. The angles $\theta$ and $\phi$ determine the temperature and stress compensation characteristics of the crystal. By judicious choice of $\theta$ and $\phi$ one can control the temperature and stress behaviour of the crystal. The values of $\theta$ and $\phi$ given in the Sinha publication may vary $\pm 2°$ because of limitations inherent in Sinha's model. An additional tolerance of $\pm 2°$ must be added to allow for deliberate control, for example, of temperature and stress compensation characteristics, such as, for example, turnover temperature. Thus, the angles $\theta$ and $\phi$ in Table 1 below have net tolerances of $\pm 4.0$.

The angle $\psi$, however determines the relative excitation of the various vibrational modes of the crystal. If is chosen at the angles specified, the c mode will be completely suppressed. Should $\psi$ vary somewhat, the c mode will begin to appear. The experimental data suggests that $\psi$ may vary $\pm 15.0°$ from the optimal values displayed in Table 1 and still permit dominance of the b mode over the c mode, depending upon the application of the resonator.

TABLE 1

| CUT | k | Q @ 10 MHz | Angles of cut ($\phi, \theta, \psi$) | S$\gamma$o improvement |
|-----|------|----------------------|-----------------------|-----------------|
| SK1 | 4.1% | 2.74 × 10$^6$ | 13°, −27.5°, −15° | 24.3 dB |
| SK2 | 4.6% | 2.45 × 10$^6$ | 14.2°, −30°, −45° | 20.4 dB |

Figure 3:
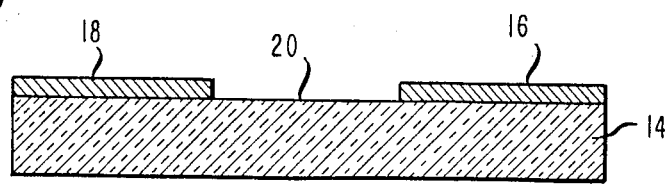
FIG. 3 is a cross sectional view of the embodiment of FIG. 2 cut along the line 3—3 and looking in the direction of the arrows.
Figure 4:
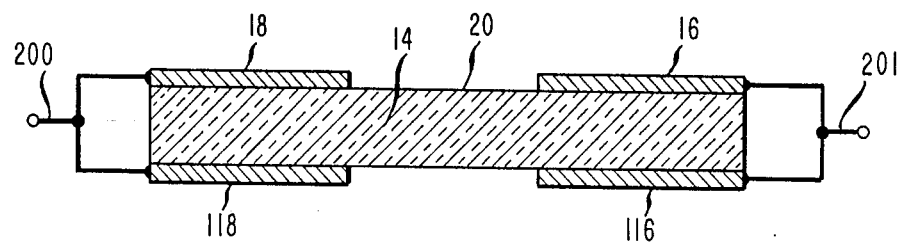
FIGS. 4–7 are cross sectional views of alternative embodiments of the present invention.
Figure 5:
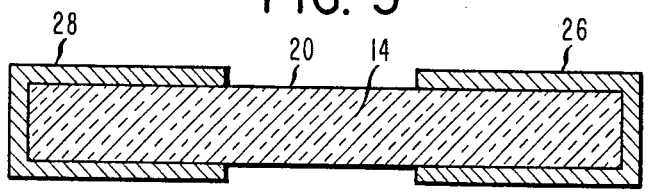

FIG. 3 is a cross sectional view of the device of FIG. 2 illustrating electrodes 16 and 18 disposed only upon the upper surface of piezoelectric plate 14. Some alternative embodiments of the present invention are illustrated in cross section in FIGS. 4–7. In each of the alternative embodiments illustrated in FIGS. 4–7, it must be borne in mind that the central resonator 14 is an SK1 or SK2 cut, while the azimuthal position of the electrodes is chosen according to the teachings of Table 1, i.e. for an SK1 cut, $\psi = -15°$, and for an SK2 cut, $\psi = -45°$. In FIG. 4, piezoelectric resonator 14 has electrodes 16 and 18 positioned on its upper surface, while electrodes 116 and 118 are positioned on its lower surface. Electrodes 16 and 116 are electrically connected together, by connector 200 while electrodes 18 and 118 are connected together by connector 201. In FIG. 5, piezoelectric resonator 14 has electrodes 26 and 28 positioned around its outer periphery and extending toward central region 20. Electrodes 26 and 28 cover portions of both the top and bottom surface of resonator 14 and are made integral, thus eliminating the need for the connectors 200 and 201 exhibited in FIG. 4.

Figure 6:
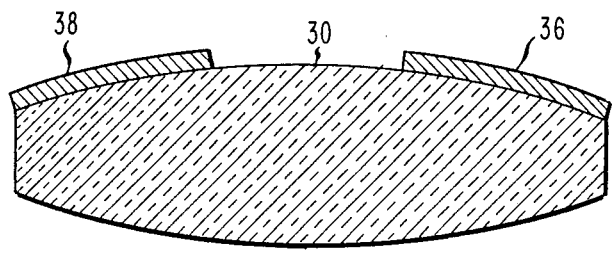
Figure 7:
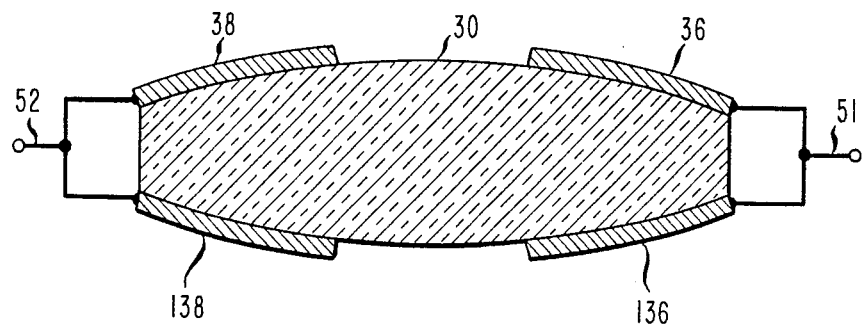

FIGS. 6 and 7 illustrate application of the present invention to convex-convex resonators 30. In FIG. 6 electrodes 36 and 38 are disposed only upon the upper surface of resonator 30. However, in FIG. 7 electrodes 136 and 138 are disposed upon the bottom surface, while electrodes 36 and 38 are disposed upon the upper surface also. Electrodes 36 and 136 are connected via connector 51, while electrodes 38 and 138 are connected together via connector 52. A variety of other resonator shapes, such as plano-convex and other electrode shapes will occur to those skilled in the art. However, in the practice of the present invention, in all cases the azmuthal position, $\psi$, of the electrodes with respect to the X' axis is to be chosen depending upon whether the SK1 or SK2 cut is used, according to the teachings of Table 1.

The illustrative embodiments herein are merely a few of those possible variations which will occur to those skilled in the art while using the inventive principles contained herein. Accordingly, numerous variations of invention are possible while staying within the spirit and scope of the invention found in the following claims and their legal equivalents.

What is claimed is:

1. A quartz piezoelectric resonator comprising a monolithic thin plate of piezoelectric material having a doubly rotated cut positioned at an orientation with respect to a standard rotational symbol YXwl ($\phi$, $\theta$), defined in terms of the X, Y, Z crystallographic axes and the major faces at polar angles $\phi$ and $\theta$, wherein thickness is in the Y direction, length in the X direction and width in the Z direction, and wherein $\phi$ is the direction of first rotation about said Z axis with respect to the X axis and $\theta$ is the direction of second rotation about an X' axis with respect to the Z axis, where the angle $\theta$ is in the range $-27.5° \pm 4.0°$, and where the angle $\phi$ is in the range $13.0° \pm 4.0°$, said plate having two opposed electrodes both positioned upon a said major face of said plate at an angle $\psi$ with respect to said X' axis where said angle $\psi$ is in the range $-15° \pm 15°$.

2. A quartz piezoelectric resonator comprising a monolithic thin plate of piezoelectric material having a doubly rotated cut positioned at an orientation with respect to a standard rotational symbol YXwl ($\phi$, $\theta$), defined in terms of the X, Y, Z crystallographic axes and the major faces at polar angles $\phi$ and $\theta$, wherein thickness is in the Y direction, length in the X direction and width in the Z direction, and wherein $\phi$ is the direction of first rotation about the Z axis with respect to the X axis and $\theta$ is the direction of second rotation about an X' axis with respect to said Z axis, where the angle $\theta$ is in the range $-30.0° \pm 4.0°$, and where the angle $\phi$ is in the range $14.2° \pm 4.0°$, said plate having two opposed electrodes both positioned upon a said major face of said plate at angle $\psi$ with respect to said X' axis where said angle $\psi$ is in the range $-45° \pm 15°$.

3. The device of claim 1 further including two additional opposed electrodes both positioned upon a second major face of said plate at the same said angle $\psi$ with respect to said X' axis.

4. The device of claim 2 further including two additional opposed electrodes both positioned upon a second major face of said plate at the same said angle $\psi$ with respect to said X' axis.

5. The device of claim 1 wherein said plate has a plano-convex shape.

6. The device of claim 2 wherein said plate has a plano-convex shape.

7. The device of claim 1 wherein said plate has a convex-convex shape.

8. The device of claim 2 wherein said plate has a convex-convex shape.

* * * * *